United States Patent [19]

Przybysz

[11] 4,353,779
[45] Oct. 12, 1982

[54] WET CHEMICAL ETCHING OF III/V SEMICONDUCTOR MATERIAL WITHOUT GAS EVOLUTION

[75] Inventor: John X. Przybysz, Penn Hills, Pa.

[73] Assignee: Westinghouse Electric Corp., Pittsburgh, Pa.

[21] Appl. No.: 292,977

[22] Filed: Aug. 14, 1981

[51] Int. Cl.$^3$ .......................................... H01L 21/312
[52] U.S. Cl. ................................. 156/659.1; 156/644; 156/662; 252/79.3
[58] Field of Search ................... 252/79.3; 156/659.1, 156/644, 662; 430/313, 316

[56] References Cited

U.S. PATENT DOCUMENTS 3,158,517 11/1964 Schwarzenberger ............... 156/648
4,100,014 7/1978 Kuhn-Kuhnenfeld et al. ..... 156/647

FOREIGN PATENT DOCUMENTS 50-09269 4/1975 Japan ................................... 252/79.3

OTHER PUBLICATIONS

J. Electrochem. Soc., vol. 125, No. 9, 1978, pp. 1510–1514, A New Etching Solution System, $H_3PO_4$–$H_2O_2$–$H_2O$, for GaAs and its Kinetics by Y. Mori et al.

Primary Examiner—William A. Powell
Attorney, Agent, or Firm—D. P. Cillo

[57] ABSTRACT

An etching solution for III/V semiconductor material, such as gallium arsenide, consists essentially of: 20 to 90 vol. % of phosphoric acid solution; 15 to 80 vol. % of hydrogen peroxide solution; 0 to 60 vol. % of water; and an amount of fluorine ion effective to provide at least 0.01 mole of fluorine ion per liter of solution, said solution being effective to etch without evolving a gaseous product.

10 Claims, 1 Drawing Figure

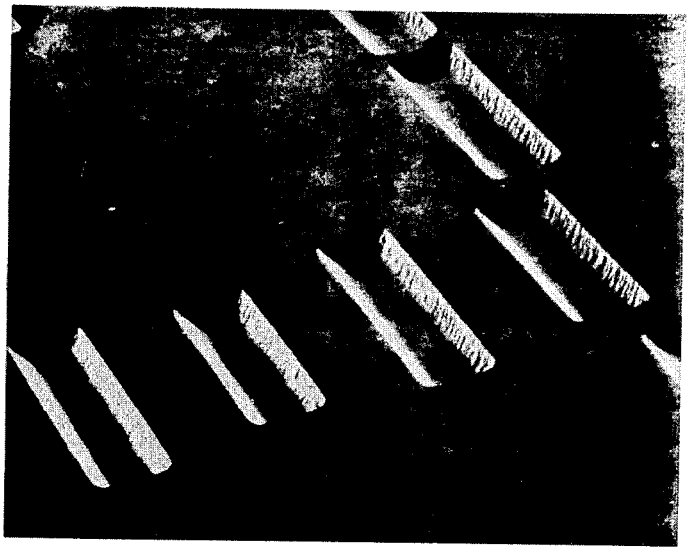

WET CHEMICAL ETCHING OF III/V SEMICONDUCTOR MATERIAL WITHOUT GAS EVOLUTION

GOVERNMENT CONTRACT

This invention was made or conceived in the course of or under Contract No. N00014-78-C-0268, with the U.S. Government, as represented by the Department of the Navy.

BACKGROUND OF THE INVENTION

In the production of integrated circuits utilizing a III/V semiconductor material, such as gallium arsenide, GaAs, for radar applications, it is often desirable to fabricate holes through the semiconductor chip. These holes in the semiconductor, called "vias", provide connections to electrical ground on the back of the chip. Vias eliminated almost all of the parasitic inductance associated with bond wires to ground. Vias can be particularly important to a good performance of large power transistors. It is also desirable to etch sharply defined, deep, flat-bottomed recess-tubs in III/V semiconductors, capable of containing a variety of electronic elements. Additionally, vias can be etched at the bottom of previously etched tubs.

One method of fabricating such vias and recesses, involves wet chemical etching. In this approach, a suitably masked wafer is immersed in a bath of etching solution. The etchant then eats through the exposed areas of the wafer. Good yield for this process is critically dependent on the etching characteristics of the chemical bath. The bath must etch smoothly and uniformly across the wafer. The etchant should be compatible with an etch mask that is easily applied to the wafer and easily removed.

Schwarzenberger, in U.S. Pat. No. 3,158,517, formed recesses in semiconductor bodies by applying an etching solution, having a pH of about 6, and consisting of 2 ml. of 30% $H_2O_2$, 1,000 ml. of $H_2O$, and 100 g. of $NH_4F$, through selected areas of photo-resist lacquer. Y. Mori et al., in *J. Electrochem. Soc.*, Vol. 125, No. 9, pp. 1510–1514, 1978, surveyed etching GaAs wafers using various mixtures of 85 wt.% $H_3PO_4$, 30 wt.% $H_2O_2$ and $H_2O$. Kuhn-kuhnenfeld et al., in U.S. Pat. No. 4,100,014, taught etching GaAs semiconductor wafers in a bath of 1 to 30 wt.% of HF, 2 to 30 wt.% of $H_2O_2$, 1 to 75 wt.% of $H_2SO_4$ and 15 to 95 wt.% of $H_2O$. While these etching solutions are effective in varying degrees, gas is usually evolved during dissolution of the GaAs. The bubbles of gas in the etch solution are a major point of difficulty, since they can be as large as the mask openings and block the flow of etchant to the wafer. What is needed then is an etching solution that will dissolve III/V semiconductor material, such as GaAs, uniformly and smoothly without the evolution of undesirable gas.

SUMMARY OF THE INVENTION

The above problems have been solved and the above need met by providing a III/V semiconductor etching solution, especially suited for gallium arsenide, GaAs, consisting essentially of 85 wt.% $H_3PO_4$ solution, 30 wt.% $H_2O_2$ solution, $H_2O$, and either 50 wt.% HF solution or a fluorine salt preferably selected from the group consisting of at least one of $NH_4F$, KF and NaF. These materials are admixed in a volume ratio of about 20 vol.% to 90 vol.% of phosphoric acid solution; 15 vol.% to 80 vol.% of hydrogen peroxide solution; 0 vol.% to 60 vol.% of water; and an amount of fluorine ion, $F^-$, effective to provide at least 0.01 mole of $F^-$ ion per liter of phosphoric acid: hydrogen peroxide:water solution; this amount of $F^-$ ion being effective to allow sharp uniform etching without any precipitation or gaseous evolution at the etching site. The pH of the etching solution will vary between about 0.5 and 4.

This etching solution is especially compatible with positive photo-resists. It acts as a particularly effective solvent solution for GaAs and is characterized by the remarkable behavior of dissolving GaAs smoothly and uniformly without evolving a gaseous product. In addition, the etching solution of this invention simplifies masking procedures. It eliminates the need for a dielectric adhesion layer, such as $Si_3N_4$, the negative photo-resists, with their high bake out temperatures and chemically corrosive strippers. Further, deep-etched tubs or recesses using the etching solution of this invention advantageously have flatter bottoms than recesses produced by sulfuric acid type etchants which are difficult to use for deep patterned etching.

BRIEF DESCRIPTION OF THE DRAWING

For a better description of the invention, reference may be made to the preferred embodiment exemplary of the invention, shown in the accompanying drawing, which is a 50X magnification photograph of a plurality of recesses etched into the surface of a GaAs wafer, using the etching solution of this invention, showing smooth, flat-bottomed tubs having sharp edge definition, capable of containing transistor-size elements.

DESCRIPTION OF THE PREFERRED EMBODIMENTS

In the method of this invention, a III/V semiconductor, i.e., a semiconductor containing elements from both Group III and Group V of the Periodic Arrangement Of The elements, for example, gallium phosphide, GaP; aluminum arsenide, AlAs; aluminum gallium arsenide, $Al_xGa_{1-x}As$; but preferably gallium arsenide, GaAs, wafers are first soaked in an acidic solution, such as 50 wt.% aqueous HCl, to prepare the surface for a photo-resist. A positive photo-resist mask is then spun, sprayed, dipped, or otherwise applied on the wafer surface, as is well known in the art. Usually, the wafer is coated with the positive photo-resist and the coated body is exposed to light with the exception of the area to be masked, which is either covered with a photoresist mask, an opaque material or otherwise shaded. The exposed area is then removed by a photoresist developer technique well known in the art.

The etching solution of this invention is then applied to the semiconductor body for a time effective to provide the etching desired through the mask free areas, usually a flat-bottomed tub recess or a via hole through the body. The etching solution is then washed from the semiconductor body with a mixture of phosphoric acid and water.

The useful etching solution consists essentially of 85 wt.% $H_3PO_4$ solution, 30 wt.% $H_2O_2$ solution, $H_2O$, and either 50 wt.% HF solution or a fluorine salt preferably selected from the group consisting of at least one of $NH_4F$, KF and NaF. These materials are admixed in a volume ratio of about 20 vol.% to 90 vol.% of phosphoric acid solution; 15 vol.% to 80 vol.% of hydrogen peroxide solution; 0 vol.% to 60 vol.% of water; and an amount of fluorine ion, $F^-$, effective to provide between about 0.01 mole and 27 moles of $F^-$ ion per liter of phosphoric acid:hydrogen peroxide:water solution, preferably between about 0.05 mole and about 0.5 mole of $F^-$ ion.

This means, for example, if NaF were to be used as the fluorine ion containing compound, 0.5 mole of NaF or $(22.9+19)/2=20.95$ grams of NaF would be added to 1 liter of phosphoric acid:hydrogen peroxide:water solution to provide 0.5 mole of $F^-$ ion. In the discussion throughout, the term "phosphoric acid solution" will mean 85 wt.% $H_3PO_4$ solution, the term "hydrogen peroxide solution" will mean 30 wt.% $H_2O_2$ solution, the term "hydrofluoric acid solution", will mean 50 wt.% HF solution, and the term "ammonium fluoride solution" will mean 40 wt.% $NH_4F$ solution.

Only these components within the ranges set forth above will provide a non-gassing effect. Use of iodine, bromine or chlorine compounds causes various gassing effects. As mentioned hereinabove, such gas evolution is highly undesirable, since the bubbles can be as large as the mask openings and block the flow of etchant to the wafer. While the etching solution of this invention is useful with all III/V semiconductor bodies, the description below is directed to the preferred gallium arsenide material.

The etching solution of this invention acts by solvating the Ga and the As. Phosphoric acid acts as a viscous, acidic medium for the etch. The hydrogen peroxide acts to oxidize the Ga and the As. Arsenic trioxide, $As_4O_6$, formed by the reaction is slightly soluble in water to give arsenious acid. Gallium is also slightly soluble, in aqueous solution formed as $[Ga(H_2O)_6]^{3+}$. However, in this viscous medium, the solubility limit is quickly reached at the site of the etch attack. The fluoride salt, preferably ammonium fluoride, is added to provide $F^-$ ions. The fluorine ions react with the gallium and arsenic ions to form aqueous ions which are highly soluble in this solution. Without the fluorine ions, the As precipitates out of solution as $As_2O_3$ crystals. These crystals obstruct the flow of etching solution and destroy the uniform action of the etch. The pH of the etching solution will vary between about 0.5 and 4, but preferably between about 1 and 2.5. The etching is carried out at from 20° C. to about 35° C. and is thus useful for room temperature operations.

The various volume % ranges set forth above are critical to useful operation of the etching solution. Use of over 90 vol.% of phosphoric acid, etching becomes extremely slow. Use of under 20 vol.% of phosphoric acid, anisotropic etching will occur, so that the shape of the etch hole will vary with crystal orientation. Use of under 15 vol.% hydrogen peroxide, the Ga and As are not effectively oxidized and an $As_2O_3$ precipitate will occur. Use of over 60 vol.% water, gives $As_2O_3$ precipitate. Use of under 0.01 mole of $F^-$ ion per liter of solution gives $As_2O_3$ precipitate, and a non-uniform etch. Use of over 27 moles of $F^-$ ion per liter of solution gives a solution dominated by hydrofluoric acid causing possible damage to the photo-resist, excessive etching and possible destruction of various wafer attachments, such as glass covers used to protect elements attached to the underside of the wafer.

EXAMPLE 1

A gallium arsenide, GaAs, semiconductor substrate, about 0.8 inch ×0.8 inch×0.02 inch thick was attached by means of wax on the bottom surface to a glass slide having the same dimensions. The GaAs top surface was prepared to receive a positive photo-resist by soaking the substrate for 5 minutes in a 1:1 volume solution of HCl and $H_2O$. Positive photo-resist was then spun onto the GaAs surface, and transistor size openings in the resist were defined by standard photolithography. A typical opening in the resist was 160 microns×2,000 microns.

Recess tub etching was then attempted, to a depth of 90±3 microns in 60 minutes, using a variety of etching solutions at 25° C. Etching solution (A) contained about 50 vol.% of 85 wt.% $H_3PO_4$, 25 vol.% of 30 wt.% $H_2O_2$, and 25 vol.% of deionized $H_2O$ to provide 1 liter of solution. To this solution was added 1 vol.% of 40 wt.% $NH_4F$ as the fluorine ion containing compound. This amount of $NH_4F$ provided 4.0 grams of $NH_4F$ or 0.1 mole of $F^-$ ion per liter of solution. The pH of the etching solution was about 1.0. This etching solution provided the outstanding recess-tubs shown in the Drawing, where the angle is 70°, with 50X magnification. As can be seen, the bottoms are flat, the sides steep, and the edge definition excellent, demonstrating the excellent adhesion of the positive photo-resist in the presence of the etching solution. In a similar fashion comparative example etching solutions (B), (C), (D), (E), and control (F) were tried. The results are set forth in Table 1 below:

TABLE 1

| Sample | Vol. % $H_3PO_4:H_2O_2:H_2O$ | Mole $F^-$ ion per l solution | Other halide ions present | Observations |
|---|---|---|---|---|
| (A) | 50:25:25 | 0.1 | none | no bubbles; sharp uniform etch. |
| *(B) | 50:12:38 | 0.3 | none | $As_2O_3$ crystals |
| *(C) | 60:20:20 | none | chlorine as 0.5 m/l of NaCl | bubbles; fair etch |
| *(D) | 50:25:25 | none | iodine as KI | foaming; not usable as etchant |
| *(E) | 50:25:25 | none | bromine as NaBr | bubbles; not usable as etchant |
| *(F) | 50:25:25 | none | none | $As_2O_3$ crystals; nonuniform etch |

*Comparative Samples.

I claim:
1. An etching solution for III/V semiconductor materials consisting essentially of 20 vol.% to 90 vol.% of phosphoric acid solution; 15 vol.% to 80 vol.% of hydrogen peroxide solution; 0 vol.% to 60 vol.% of water; and an amount of fluorine ion effective to provide at least 0.01 mole of fluorine ion per liter of solution, said etching solution having a pH of between about 0.5 and 4.

2. The etching solution of claim 1, where the phosphoric acid is an 85 wt.% aqueous solution and the hydrogen peroxide is a 30 wt.% aqueous solution.

3. The etching solution of claim 1, where the fluorine ion is added as a compound selected from the group consisting of aqueous HF and fluorine salt.

4. The etching solution of claim 1, wherein the fluorine ion is added as a compound selected from the group consisting of $NH_4F$, KF, NaF and mixtures thereof.

5. The etching solution of claim 1, wherein the amount of fluorine ion added is effective to provide between about 0.01 mole and 27 moles of $F^-$ ion per liter of solution, and the III/V semiconductor material is gallium arsenide.

6. The etching solution of claim 1, wherein the amount of fluorine ion added is effective to provide between about 0.05 mole and 0.5 mole of $F^-$ ion per liter of solution, and the fluorine ion is added as 40 wt.% $NH_4F$ solution.

7. A method of etching a III/V semiconductor material comprising the steps of:
   (A) applying a photo-resist mask on the body of the semiconductor material in a predetermined, and pattern
   (B) applying to the semiconductor material an etching solution consisting essentially of: 20 vol.% to 90 vol.% of phosphoric acid solution; 15 vol.% to 80 vol.% of hydrogen peroxide solution; 0 vol.% to 60 vol.% of water; and an amount of fluorine ion effective to provide at least 0.01 mole of fluorine ion per liter of solution, said etching solution having a pH of between about 0.5 and 4, to etch the unmasked portion of the semiconductor without evolving a gaseous product.

8. The method of claim 7, where as a first step, the semiconductor surface is prepared for the photo-resist by applying an acid solution, and where the fluorine ion is added as a compound selected from the group consisting of aqueous HF and fluorine salt.

9. The method of claim 7, including a washing last step, and where the fluorine ion is added as a compound selected from the group consisting of $NH_4F$, $KF$, $NaF$ and mixtures thereof.

10. The method of claim 7, where the amount of fluorine ion added is effective to provide between about 0.01 mole and 27 moles of $F^-$ ion per liter of solution and the III/V semiconductor material is gallium arsenide.

* * * * *